United States Patent
Alarcon et al.

(10) Patent No.: US 10,362,710 B2
(45) Date of Patent: Jul. 23, 2019

(54) BELOW GRADE ENCLOSURE

(71) Applicant: American Products, L.L.C., Strafford, MO (US)

(72) Inventors: Sergio A. Alarcon, Austin, TX (US); William C. Biston, Springfield, MO (US); Timothy L. Dudley, Marshfield, MO (US); Alan L. Rost, Marshfield, MO (US)

(73) Assignee: AMERICAN PRODUCTS, L.L.C., Strafford, MO (US)

( * ) Notice: Subject to any disclaimer, the term of this patent is extended or adjusted under 35 U.S.C. 154(b) by 348 days.

(21) Appl. No.: 14/870,156

(22) Filed: Sep. 30, 2015

(65) Prior Publication Data

US 2016/0100493 A1    Apr. 7, 2016

Related U.S. Application Data

(60) Provisional application No. 62/058,598, filed on Oct. 1, 2014.

(51) Int. Cl.
| | |
|---|---|
| *H05K 7/18* | (2006.01) |
| *H04Q 1/14* | (2006.01) |
| *H04Q 1/02* | (2006.01) |
| *G02B 6/44* | (2006.01) |

(52) U.S. Cl.
CPC ............. *H05K 7/186* (2013.01); *H04Q 1/026* (2013.01); *H04Q 1/14* (2013.01); *G02B 6/445* (2013.01); *G02B 6/4451* (2013.01)

(58) Field of Classification Search
CPC .......... H05K 7/186; H04Q 1/026; H04Q 1/14; G02B 6/445; G02B 6/4451
USPC ............... 109/45, 47, 59 R, 59 T; 292/48, 292/240–242; 70/121–123, 135, 138, 70/139, 158–173; 312/215, 222
See application file for complete search history.

(56) References Cited

U.S. PATENT DOCUMENTS

| | | | | |
|---|---|---|---|---|
| 781,551 | A * | 1/1905 | Quillin | E05B 83/247 292/48 |
| 938,250 | A * | 10/1909 | Lanius | E05B 83/247 27/35 |
| 1,321,341 | A * | 11/1919 | Troyer | E05B 83/24 292/6 |
| 1,357,864 | A * | 11/1920 | Harrington | E05B 65/0057 27/DIG. 1 |

(Continued)

OTHER PUBLICATIONS

Clearfield (Oct. 1, 2014) "FieldSmart Fiber Scalability Center (FSC): Below Grade Cabinet," Clearfield, Inc.

(Continued)

*Primary Examiner* — Lloyd A Gall
(74) *Attorney, Agent, or Firm* — Kutak Rock LLP; James H. Jeffries

(57) ABSTRACT

An enclosure for telecommunications equipment suitable for below grade use with fiber optic equipment or electrical equipment is described. The enclosure incorporates a cam operated latching mechanism and compression plates to seal the door closed and create a water resistant or water tight seal. The enclosure may be used in a variety of applications, including above and below grade. The enclosure may also include a lift assist system to allow it to be easily raised and lowered from a below grade stowed position to an above grade service position.

9 Claims, 15 Drawing Sheets

(56) References Cited

U.S. PATENT DOCUMENTS

| | | | | |
|---|---|---|---|---|
| 1,429,116 A * | 9/1922 | Taylor | E05B 65/0057 | 292/45 |
| 1,584,294 A * | 5/1926 | Heise | E05G 1/02 | 109/47 |
| 1,638,748 A * | 8/1927 | Santee | E05C 9/043 | 292/48 |
| 1,740,827 A * | 12/1929 | Mayea | E05C 9/043 | 292/48 |
| 1,808,403 A * | 6/1931 | Eklund | F16J 13/08 | 220/243 |
| 1,871,834 A * | 8/1932 | Astrom | C10B 25/08 | 220/320 |
| 2,295,324 A * | 9/1942 | Arthur | E05C 9/06 | 114/117 |
| 2,369,584 A * | 2/1945 | Lundholm | E05C 9/063 | 292/214 |
| 2,460,961 A * | 2/1949 | Wilson | E05C 9/06 | 114/117 |
| 2,759,884 A * | 8/1956 | Gillott | C10B 25/12 | 202/248 |
| 3,240,523 A * | 3/1966 | Heimann | E05B 17/0033 | 292/198 |
| 3,281,177 A * | 10/1966 | Tenenbaum | E05C 19/002 | 292/202 |
| 3,328,062 A * | 6/1967 | Geiger | A47L 15/4259 | 292/123 |
| 3,510,404 A * | 5/1970 | Freund | C10B 25/12 | 202/248 |
| 3,630,853 A * | 12/1971 | Grumm | C10B 25/12 | 110/176 |
| 4,022,137 A * | 5/1977 | Chiu | E05G 1/10 | 109/44 |
| 4,107,879 A * | 8/1978 | Steimann | C10B 25/12 | 202/248 |
| 4,310,187 A * | 1/1982 | Loy | E05C 9/06 | 292/111 |
| 4,369,717 A * | 1/1983 | Bollier | E05G 1/00 | 109/45 |
| 4,625,658 A * | 12/1986 | Hodges | E05G 1/00 | 109/35 |
| 4,685,249 A * | 8/1987 | Jacox | E05B 65/001 | 292/241 |
| 4,819,976 A * | 4/1989 | Bert | E05B 65/1013 | 292/48 |
| 4,984,832 A * | 1/1991 | Canepa | E05C 9/06 | 292/36 |
| 5,103,592 A * | 4/1992 | Janitzky | E06B 5/12 | 292/341.18 |
| 5,189,723 A | 2/1993 | Johnson et al. | | |
| 5,274,731 A | 12/1993 | White | | |
| 5,333,920 A * | 8/1994 | de Rover | B63B 43/32 | 292/240 |
| RE34,955 E | 5/1995 | Anton et al. | | |
| 5,653,485 A * | 8/1997 | Campbell | E05C 9/02 | 292/207 |
| 5,734,774 A | 3/1998 | Morrell | | |
| 5,734,776 A | 3/1998 | Puetz | | |
| 5,758,003 A | 5/1998 | Wheeler et al. | | |
| 5,931,512 A * | 8/1999 | Fan | E05C 9/06 | 292/48 |
| 5,939,669 A | 8/1999 | Finzel et al. | | |
| 5,969,294 A | 10/1999 | Eberle et al. | | |
| 6,316,728 B1 | 11/2001 | Hoover et al. | | |
| 6,327,879 B1 * | 12/2001 | Malsom | E05B 65/0811 | 292/197 |
| RE37,489 E | 1/2002 | Anton et al. | | |
| 6,424,781 B1 | 7/2002 | Puetz et al. | | |
| D466,087 S | 11/2002 | Cuny et al. | | |
| 6,477,807 B1 * | 11/2002 | Crondahl | E05B 17/0025 | 16/366 |
| 6,483,977 B2 | 11/2002 | Battey et al. | | |
| 6,496,640 B1 | 12/2002 | Harvey et al. | | |
| 6,535,682 B1 | 3/2003 | Puetz et al. | | |
| 6,772,566 B1 | 8/2004 | Machledt et al. | | |
| 6,778,752 B2 | 8/2004 | Laporte et al. | | |
| 7,139,461 B2 | 11/2006 | Puetz et al. | | |
| 7,142,764 B2 | 11/2006 | Allen et al. | | |
| 7,146,089 B2 | 12/2006 | Reagan et al. | | |
| 7,149,398 B2 | 12/2006 | Solheid et al. | | |
| 7,233,731 B2 | 6/2007 | Solheid et al. | | |
| 7,277,620 B2 | 10/2007 | Vongseng et al. | | |
| 7,330,625 B2 | 2/2008 | Barth | | |
| 7,333,320 B2 | 2/2008 | Standish et al. | | |
| 7,343,762 B1 * | 3/2008 | East | E05B 13/108 | 292/36 |
| 7,347,070 B1 | 3/2008 | Spector | | |
| 7,457,503 B2 | 11/2008 | Solheid et al. | | |
| 7,475,515 B2 | 1/2009 | Machledt et al. | | |
| 7,492,575 B2 | 2/2009 | Irmer et al. | | |
| 7,519,259 B2 | 4/2009 | Smith et al. | | |
| 7,623,749 B2 | 11/2009 | Reagan et al. | | |
| 7,646,958 B1 | 1/2010 | Reagan et al. | | |
| 7,809,232 B2 | 10/2010 | Reagan et al. | | |
| 7,975,515 B2 | 7/2011 | Ygnelzi et al. | | |
| 8,047,619 B2 * | 11/2011 | Amstutz | A47F 3/002 | 312/117 |
| 8,366,118 B2 | 2/2013 | Schilling | | |
| 8,519,263 B2 | 8/2013 | Schilling | | |
| 8,813,916 B2 | 8/2014 | Schilling | | |
| 2002/0088381 A1 * | 7/2002 | Nomura | E05G 1/00 | 109/47 |
| 2003/0174996 A1 | 9/2003 | Henschel et al. | | |
| 2004/0074852 A1 | 4/2004 | Knudsen et al. | | |
| 2004/0194991 A1 | 10/2004 | Hutchin et al. | | |
| 2004/0228598 A1 | 11/2004 | Allen et al. | | |
| 2005/0002633 A1 | 1/2005 | Solheid et al. | | |
| 2006/0268495 A1 | 11/2006 | Standish et al. | | |
| 2006/0278426 A1 | 12/2006 | Barth | | |
| 2007/0031100 A1 | 2/2007 | Garcia et al. | | |
| 2008/0019655 A1 | 1/2008 | Vongseng et al. | | |
| 2008/0025684 A1 | 1/2008 | Vongseng et al. | | |
| 2008/0031585 A1 | 2/2008 | Solheid et al. | | |
| 2008/0042535 A1 | 2/2008 | Guzzo et al. | | |
| 2008/0211364 A1 | 9/2008 | Solheid et al. | | |
| 2008/0240665 A1 | 10/2008 | Barth | | |
| 2008/0285934 A1 | 11/2008 | Standish et al. | | |
| 2008/0317425 A1 | 12/2008 | Smith et al. | | |
| 2009/0022467 A1 | 1/2009 | Puetz et al. | | |
| 2009/0072685 A1 | 3/2009 | Bundza et al. | | |
| 2009/0074372 A1 | 3/2009 | Solheid et al. | | |
| 2009/0087157 A1 | 4/2009 | Smith et al. | | |
| 2009/0103879 A1 | 4/2009 | Tang et al. | | |
| 2009/0175588 A1 | 7/2009 | Brandt et al. | | |
| 2009/0190896 A1 | 7/2009 | Smith et al. | | |
| 2009/0196565 A1 | 8/2009 | Vongseng et al. | | |
| 2009/0260925 A1 | 10/2009 | Schilling | | |
| 2009/0263706 A1 | 10/2009 | Schilling | | |
| 2009/0285540 A1 | 11/2009 | Reagan et al. | | |
| 2009/0297111 A1 | 12/2009 | Reagan et al. | | |
| 2009/0309309 A1 | 12/2009 | Schilling | | |
| 2010/0288523 A1 | 11/2010 | Schilling | | |
| 2011/0203334 A1 | 8/2011 | Rix et al. | | |
| 2011/0317973 A1 | 12/2011 | Rapp et al. | | |
| 2012/0256526 A1 | 10/2012 | Wei et al. | | |
| 2013/0101262 A1 | 4/2013 | Wei et al. | | |
| 2014/0196380 A1 | 7/2014 | Burke | | |
| 2015/0252608 A1 * | 9/2015 | Hall | E05G 1/026 | 109/47 |

OTHER PUBLICATIONS

Intex (Feb. 12, 2010), brochure of a stainless steel submersible electrical cabinet, Intex/2256.

* cited by examiner

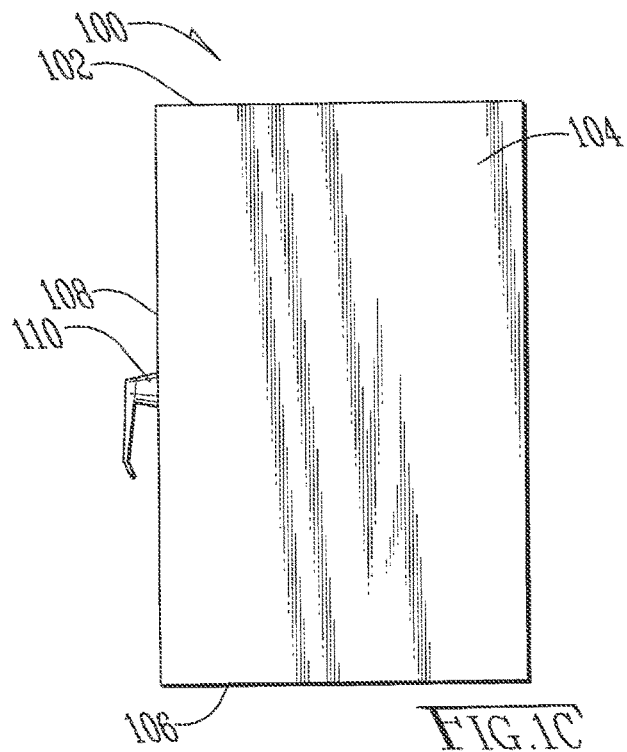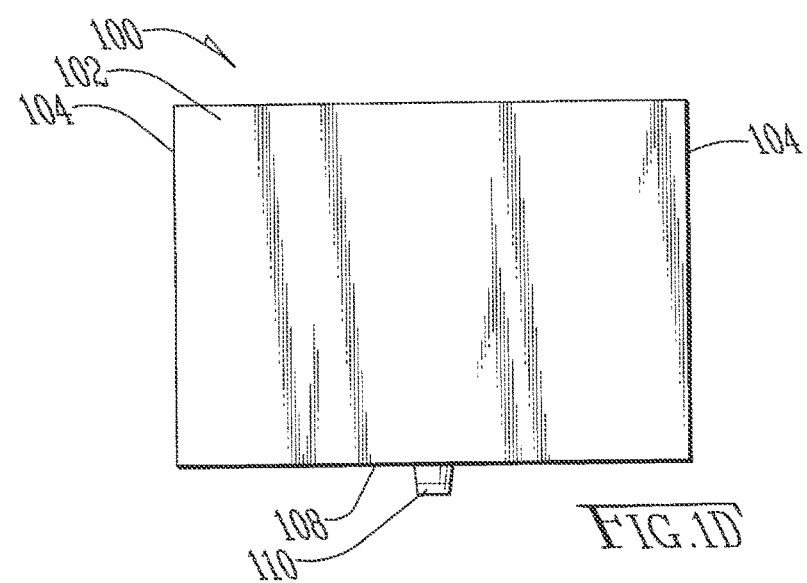

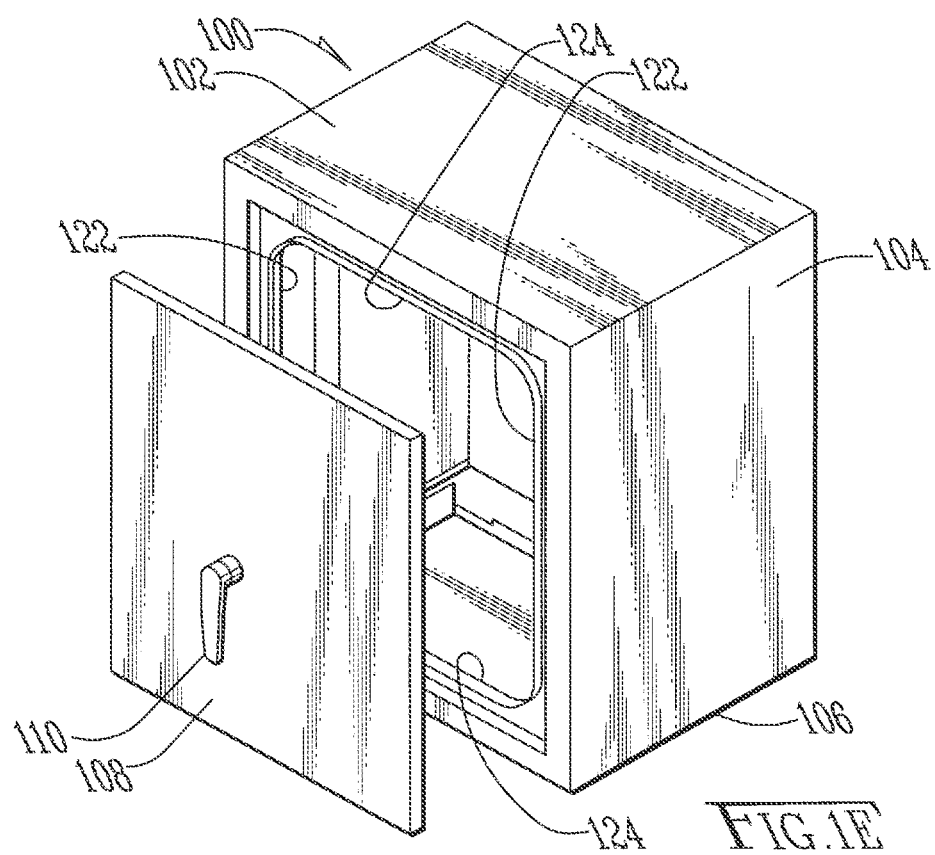

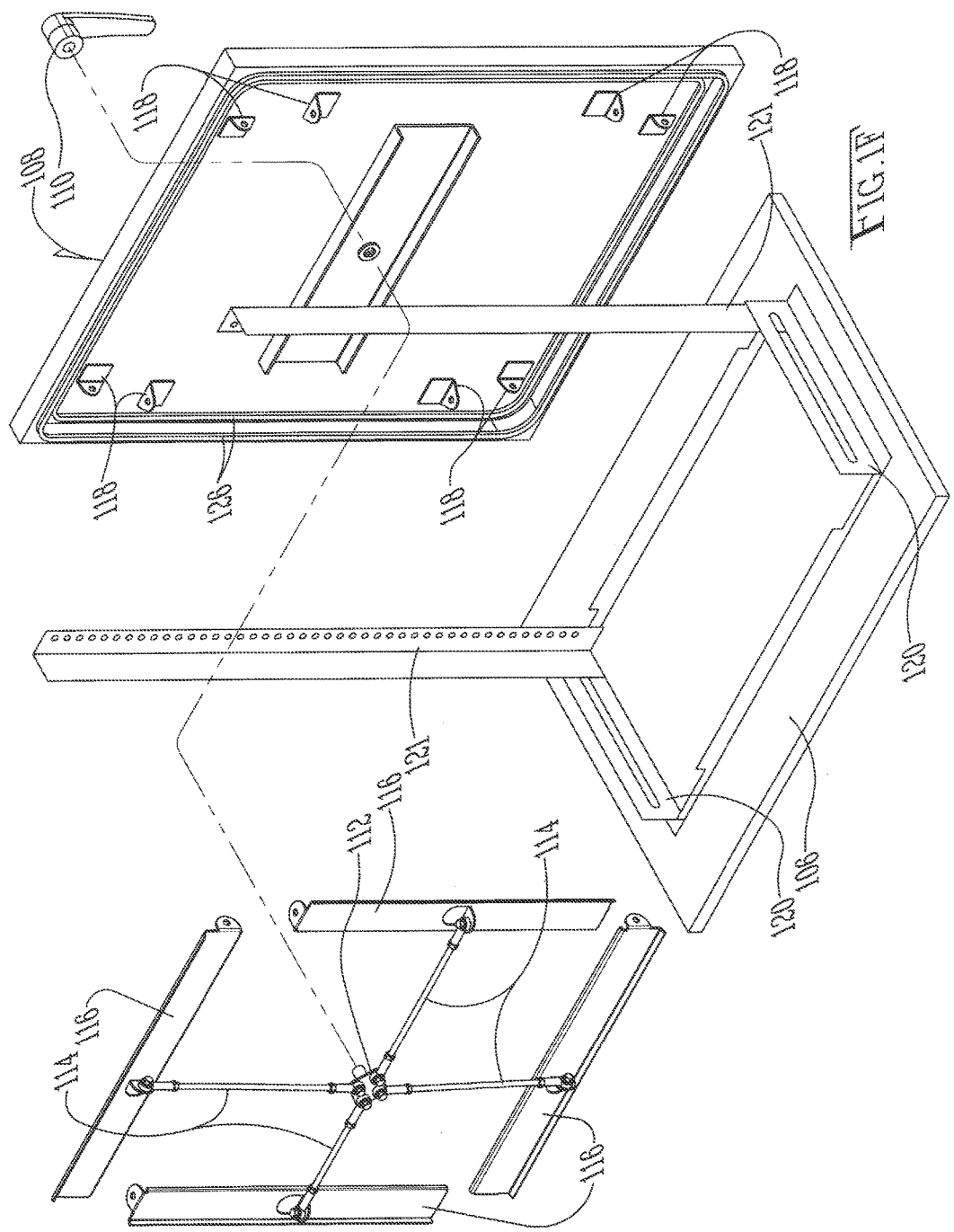

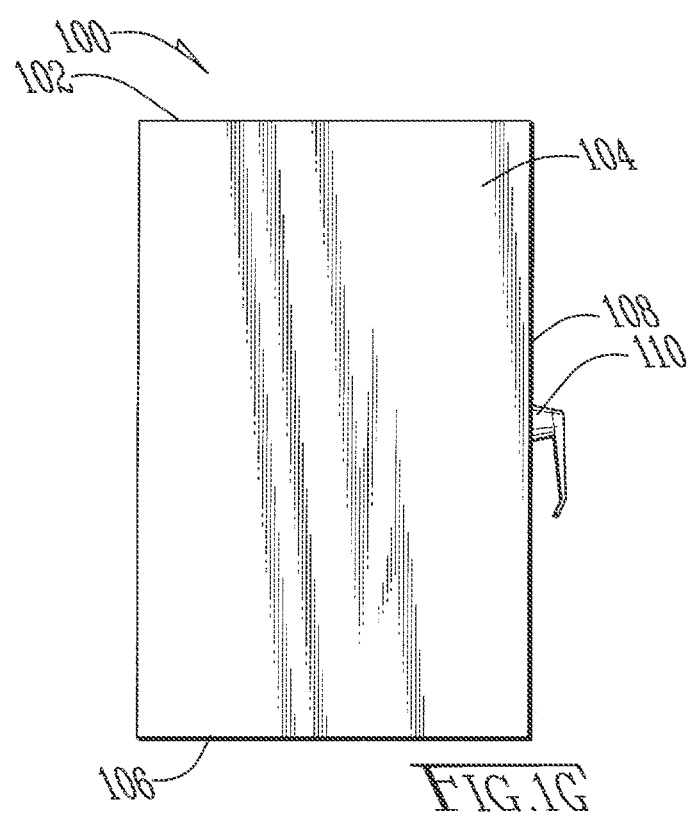

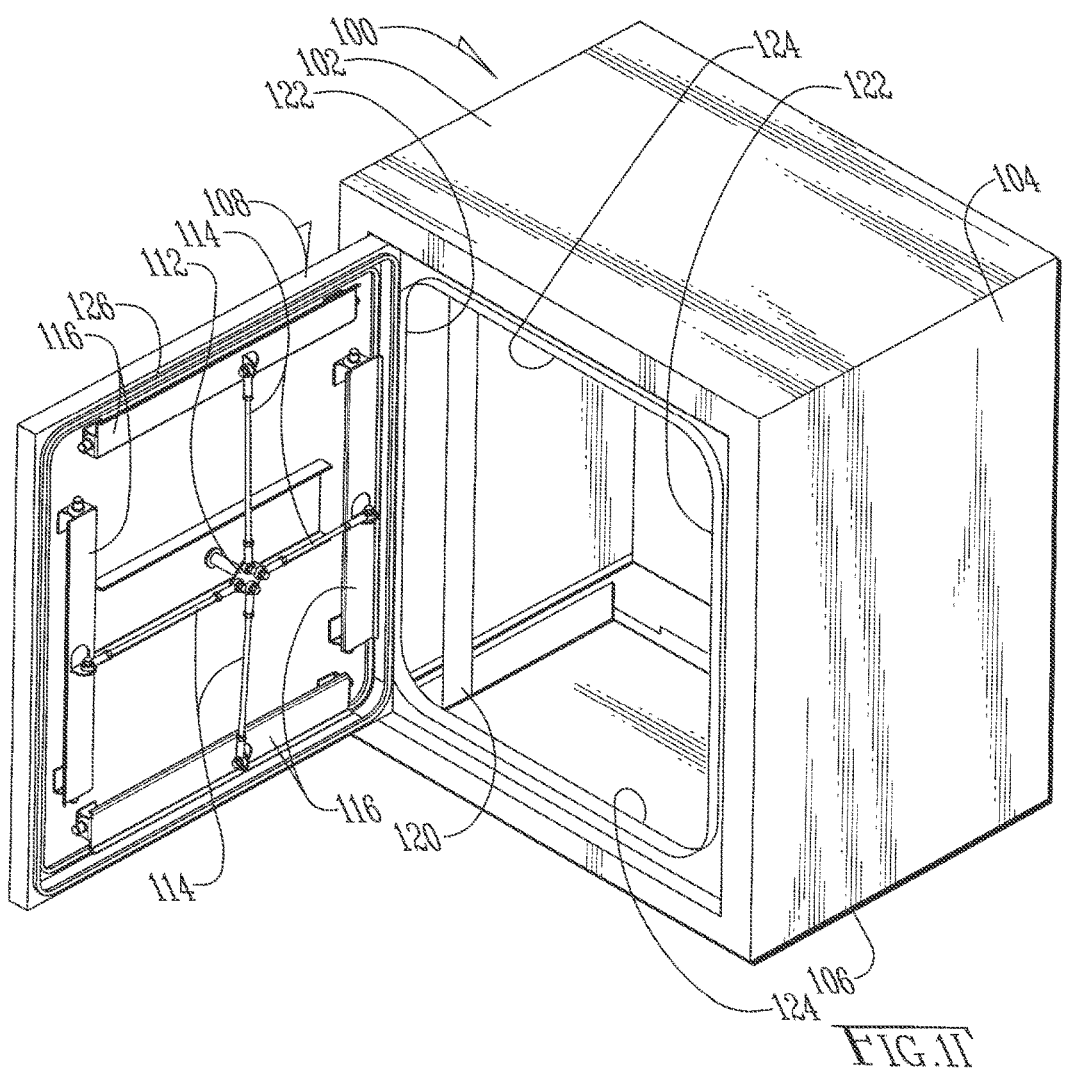

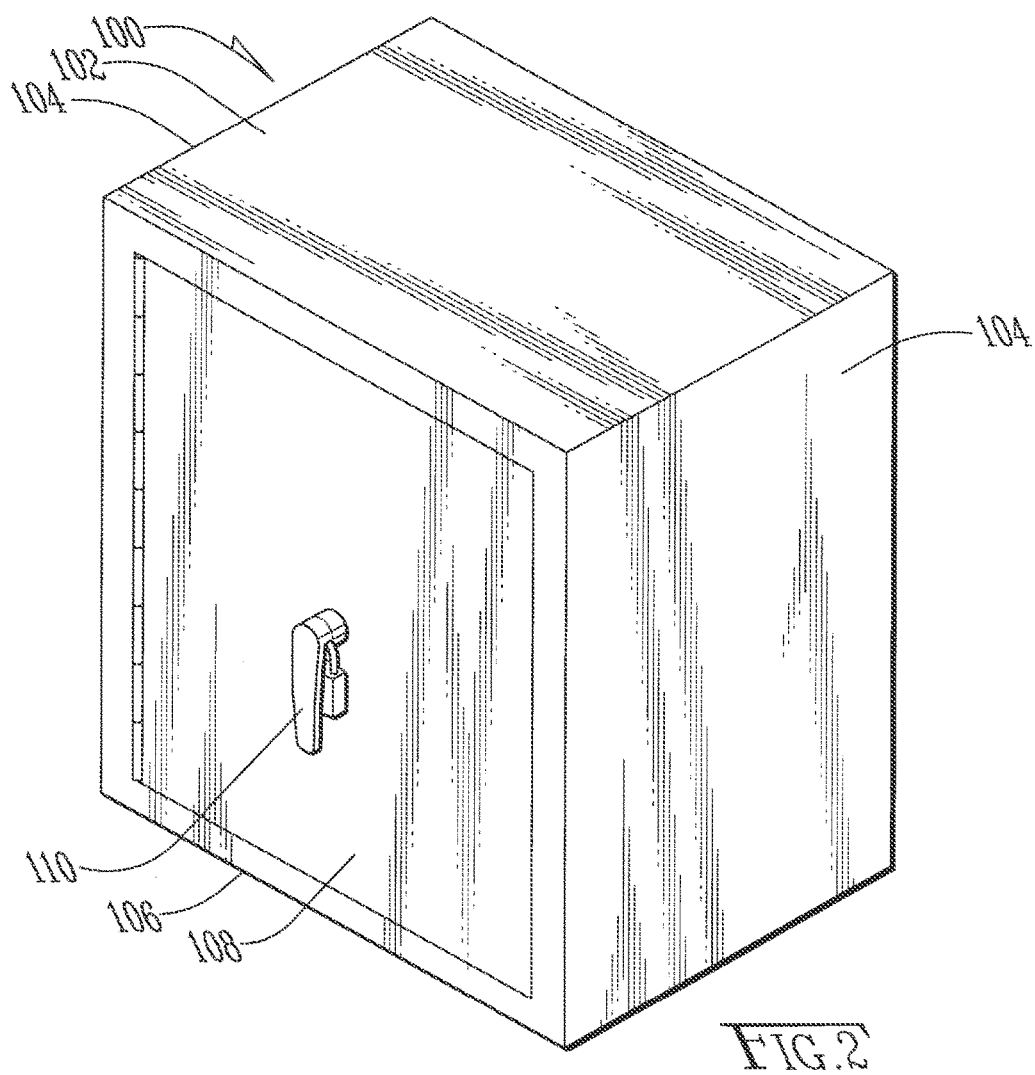

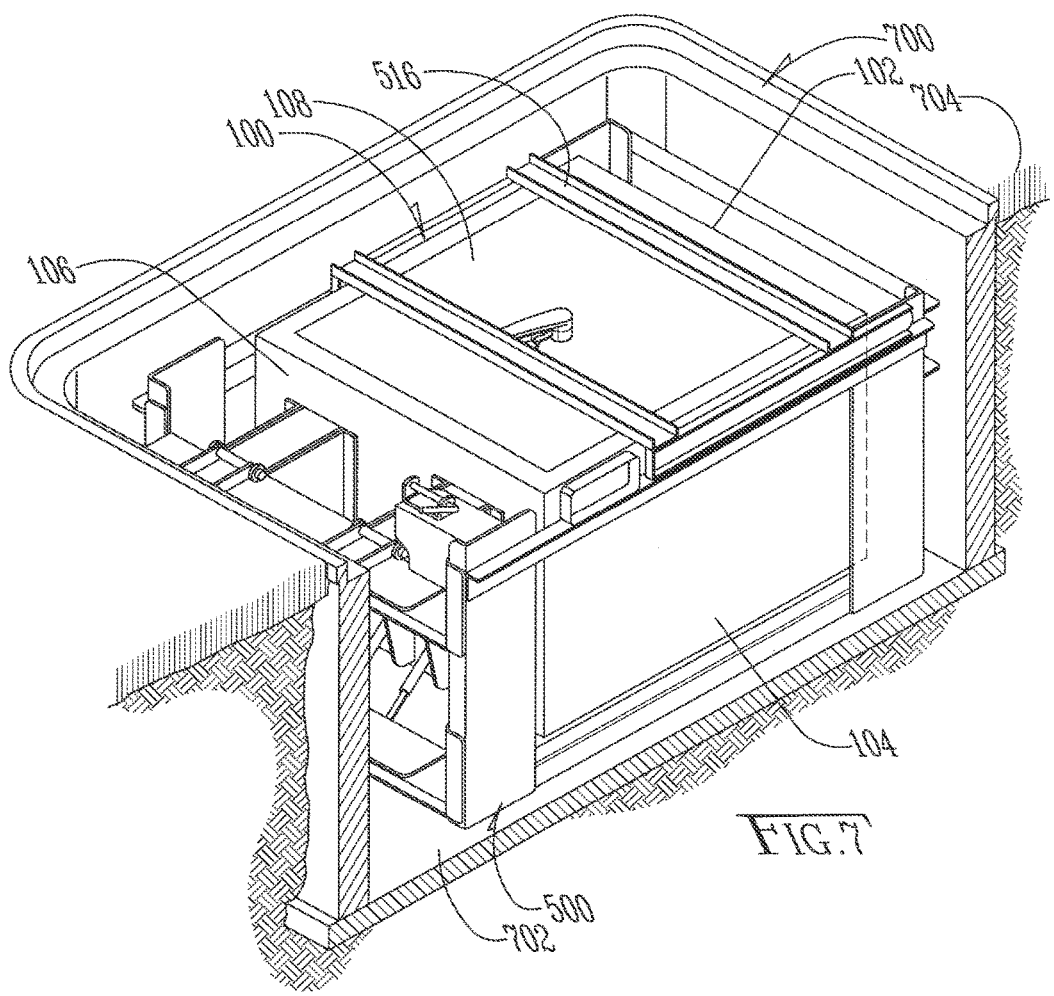

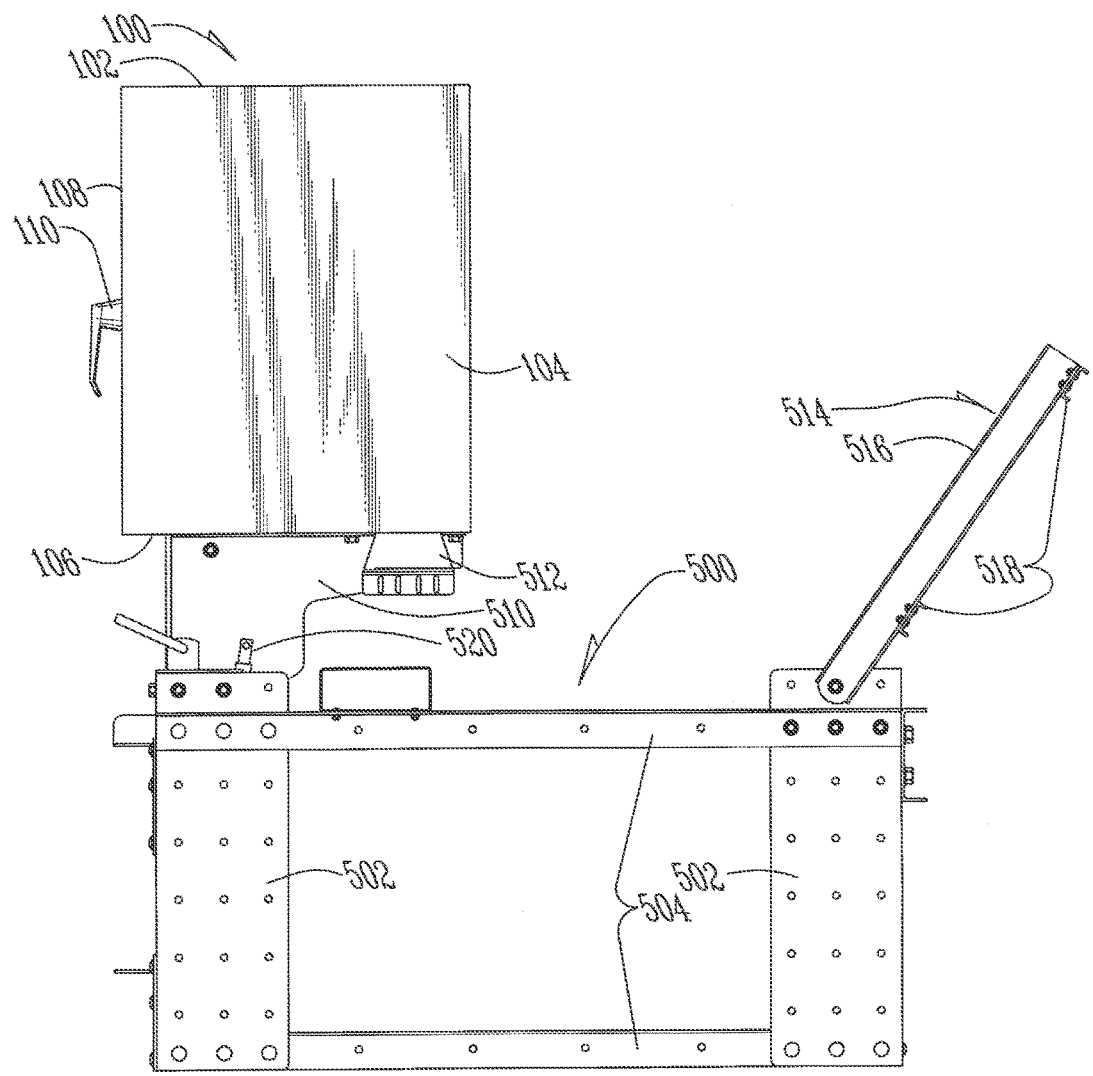

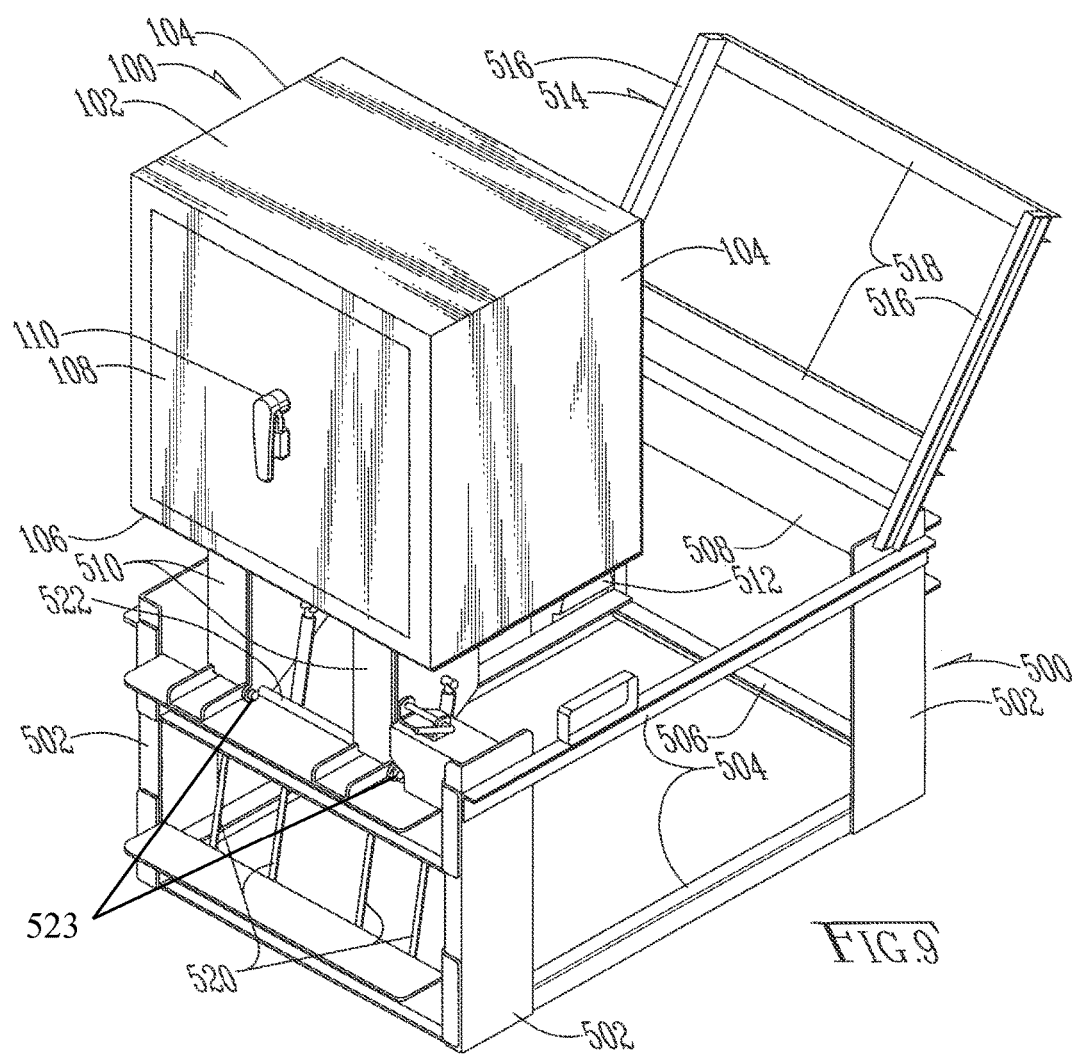

BELOW GRADE ENCLOSURE

RELATED APPLICATIONS

This application claims priority of U.S. Provisional 62/058,598 filed Oct. 1, 2014, which is incorporated herein by reference.

FIELD OF THE INVENTION

The enclosure described herein is in the field of protective enclosures for telecommunications, electrical, optical, or other types of equipment installed in outdoor locations. In some embodiments, the enclosures provide protection to equipment installed in a below grade installation.

BACKGROUND OF THE INVENTION

Telecommunications equipment is crucial to the data networks relied upon by modern society. The data networks include any type of network for the transport of data, without regard to the format of the data or the method of transport. The telecommunications equipment includes network interconnections and devices for fiber optic networks, copper-based networks, and other telecommunication technologies as they may be developed in the future. The networks require interconnection points and equipment for the operation of the networks at various locations. Many of these interconnections and equipment locations are distributed and are not located inside buildings. As a result, enclosures to protect the equipment from the outdoor environment are a necessary component of such networks.

One example of such an enclosure is an enclosure for an outdoor distribution hub for a fiber optic network. Outdoor Fiber Distribution Hub (FDH) products serve as a passive interface between the telecommunication provider's feeder network and their individual distribution cables serving their customers. FDHs are sometimes referred to as fiber hubs or service access terminals, and they perform a similar function as the traditional telephone network Serving Area Closure (SAC) does for copper networks. The FDH is exemplary of the type of the below grade enclosures described herein, but is not limiting as to the use or design of such enclosures.

The principle function of an FDH is to provide mechanical and environmental protection for fiber optic components in an enclosure that permits fiber optic communications service to be divided among customers, broadcast fashion. In some embodiments, an FDH also provides a management system for optical splitters, fiber, and connectors providing considerable flexibility to the optical plant network. This enables the local feeder/distribution/loop network to be configured to cost-effectively meet the needs of both the service provider and their customer. In addition, the FDH serves as a convenient test access point to verify the integrity of the service provider network and the customer equipment.

Depending on the specific needs of the service provider, the feeder cable side of the FDH often will be used to terminate Outside Plant (OSP) fiber optic cables to smaller size distribution fiber cable to serve individual customers. Since the FDHs store cable splices and optical connector cross-connects, they must be capable of resisting damage from the outside plant environment they will occupy. In some cases, the FDHs may be located below grade, on a pad as a ground-mounted closure, or on a pole as a pole-mounted closure. The FDH is usually secured with a lock that prevents access by the public or other non-service provider personnel. The FDH is not intended to provide access for customers, either residential or business.

Optical feeder cable enters the closure (often from the rear or bottom of the closure) and is spliced to optical fiber in the FDH's splice panel. Output fiber pigtails or jumpers from the splitter module are used as optical pathways between the optical signal provided by the service provider in the feeder cable to optical pathways to the customer receiving this service as optical cross-connects. The splitter output fibers are terminated on the optical distribution panel, which provides a direct pathway to the local customer for the service. Each fiber from the distribution cable to the customer is terminated on the rear side of the optical cross-connect panel. All routing pathways within the FDH meet general acceptable fiber and cable handling and geometry requirements used in the industry. In addition, the FDH is equipped with a parking area to store optical fibers not in use prior to deployment as cross connects on the fiber cross-connect panel being used as optical input to a 1×N optical splitter module.

In other embodiments, the enclosures described herein may provide environmental protection for components of copper networks, coaxial networks, electrical conduit, low voltage electronic systems, or any other interconnections or equipment that require a environmental protection. The equipment installed in the enclosure may include any type of equipment necessary for the operation of the network.

In some embodiments, the below grade enclosure includes a lift assist system to allow a network technician to raise the enclosure to above ground level for more convenient access to the interior of the enclosure.

FDHs and other similar enclosures are most commonly located in OSP uncontrolled environments. It is possible, however, that these closures could be used inside a building in a controlled environment.

Until recently, optical connectors were traditionally found in the service provider's Central Office (CO) (head end) or in remote locations that are environmentally controlled, such as Cable Entrance Vaults (CEVs) or Remote Terminals (RTs). More recently, as broadband fiber architectures have penetrated the local distribution loop, connectors are increasingly found in optical nodes (Hybrid Fiber Coax [HFC] networks) and optical network units (FTTC networks). The enclosures for these network elements, although typically not hermetically sealed, do provide robust mechanical and environmental protection for the optoelectronic equipment. In addition, the heat dissipated from the electronics is often sufficient to maintain a relatively dry environment.

FDHs, however, contain only passive optical components. In keeping with the need for easy craft access in an OSP environment, both for the service provider and the customer, it is desirable to avoid hermetically sealing the FDH. Therefore, the optical connectors and possible optical components will be subjected to the harsh OSP environment. Similarly, enclosures for networks of other types may also need to provide environmental protection to active or passive network components or interconnections.

The enclosures for such networks, such as for outdoor FDHs, may be deployed in a variety of locations. A brief description of each deployment environment is provided below.

In some deployments, the enclosures are deployed in a protected environment such as a Cable Entrance Vault (CEV), telecommunications closet, computer room, or similar location. The enclosure need provide only minimal environmental protection (dust and water spray resistance are applicable).

In other deployments, an enclosure designed for attachment to a building exterior may be utilized. In such deployments, full frontal access is generally required. The enclosure may be required to be flood proof in some applications.

In ground level outdoor deployments, primary mechanical and environmental protection comes from the outer enclosure (e.g., pedestal and cabinet), which may contain smaller sub-enclosures dedicated to the needs of the service provider and the customer. These may be either flood-proof or rain-resistant.

In other deployments, the enclosures are installed on an aerial pole or stand. In this environment, free-breathing enclosures are acceptable provided they use fiber, cable, and fusion splices meeting current Telcordia environmental requirements.

In other deployments, the enclosures are installed below grade in conjunction with a handhole or similar installation.

The enclosure described and claimed herein may be used in various embodiments in any of the deployment types. In some embodiments, the enclosures have specific features to provide improved performance over other enclosures in a below grade deployment.

SUMMARY OF THE INVENTION

The inventive enclosure described and claimed herein is for telecommunications equipment. The enclosure is formed from an enclosure body with a top, a bottom, and three side walls forming an cubical enclosure with an open side. The enclosure body has a top compression rail, a bottom compression rail and two side compression rails adjacent to the open side of the enclosure body along the top, bottom and side walls of the enclosure body, respectively. The enclosure includes a door for attachment over the open side of the enclosure body. A rotatable latch is attached to the door. A cam is attached to the latch on the inside surface of the door. Several compression plates are pivotally attached to the inside surface of the door along the inside edges of the plates. Several actuating rods are pivotally attached to the cam at one end, and pivotally attached to a compression plate at the other end. Rotation of the latch causes rotation of the cam, thereby causing the actuating rods to extend, pivoting the compression plates to compress the compression rails between the compression plates and the inside surface of the door, thus securing the door in place and creating a seal between the door and the enclosure body.

In one embodiment of the enclosure there are four compression plates for engaging the top compression rail, bottom compression rail, and two side compression rails of the enclosure body. Some embodiments of the enclosure have one or more gasket attached to the inside surface of the door or to the compression rails.

Some embodiments of the enclosure include a lift assist system to reduce the force needed to raise and lower the enclosure from an underground position for service. The lift system is made of a frame sized to receive the enclosure body, and one or more lift brackets pivotally attached to the frame and attached to the bottom of the enclosure body. The lift brackets pivot from a stowed position in which the enclosure body is disposed within the frame to a service position in which the enclosure body is disposed outside the frame. In some embodiments, one or more lift assist struts are included to reduce the force needed to move the enclosure body from the stowed position to the service position and back. The lift assist struts are pivotally attached at one end to the frame and at the other end to a lift bracket.

Some embodiments of the invention include a top component for securing the enclosure body within the frame when the enclosure body is in the stowed position. The top component may be made of one or more stile pivotally attached to the frame, and one or more rail attached to the stiles to secure the enclosure body within the frame in the stowed position. The top component may be pivoted away from the enclosure body to allow the enclosure body to be raised to the service position.

One method of using the enclosure in a below grade vault, comprises the steps of installing the lift assist system in the below grade vault, attaching the enclosure body to the lift brackets of the lift system in the service position, installing equipment within the enclosure body, securing the door to the enclosure body, and lowering the enclosure body to the stowed position.

The method of using the enclosure may also include the steps of raising the enclosure body to the service position, removing the door from the enclosure body, servicing the equipment installed within the enclosure body, securing the door to the enclosure body, and lowering the enclosure body to the stowed position.

The step of securing the door to the enclosure body may comprise the steps of disposing the door over the open side of the enclosure body, and rotating the latch to pivot the compression plates to compress the compression rails between the compression plates and the inside surface of the door.

The method of using the enclosure may also include the steps of pivotally attaching a top component to the frame, wherein the top component has at least one rail for securing over the enclosure body in the stowed position, pivoting the top component into a lowered position to secure the enclosure body in the stowed position, and pivoting the top component into a raised position to allow the enclosure body to be lifted to the service position.

BRIEF DESCRIPTION OF THE DRAWINGS

FIG. 1C is a side view of an embodiment of the below grade enclosure.

FIG. 1D is a top view of an embodiment of the below grade enclosure.

FIG. 1E is a perspective view of an embodiment of the below grade enclosure.

FIG. 1F is an exploded perspective view of a portion of an embodiment of the below grade enclosure.

FIG. 1G is a side view of an embodiment of the below grade enclosure.

FIG. 1I is a perspective view of an embodiment of the below grade enclosure.

FIG. 2 is a perspective view of an embodiment of the below grade enclosure.

FIG. 7 is a cross-section view of an embodiment of the below grade enclosure with a lift assist system in a below grade installation.

FIG. 8 is a side view of an embodiment of the below grade enclosure with a lift assist system.

FIG. 9 is a perspective view of an embodiment of the below grade enclosure with a lift assist system.

DETAILED DESCRIPTION OF THE INVENTION

Figure 1A:
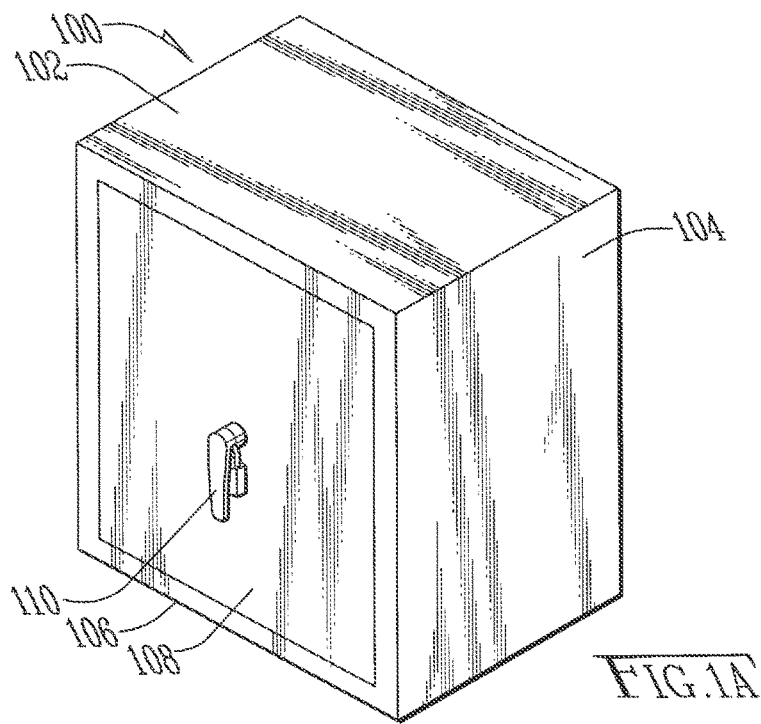
FIG. 1A is a perspective view of an embodiment of the below grade enclosure.
Figure 1B:
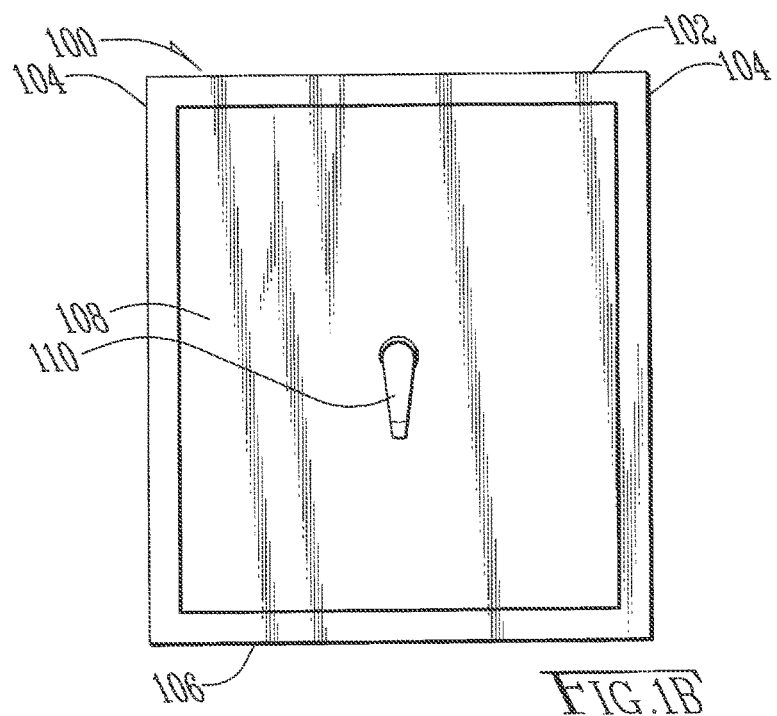
FIG. 1B is a front view of an embodiment of the below grade enclosure.
Figure 1H:
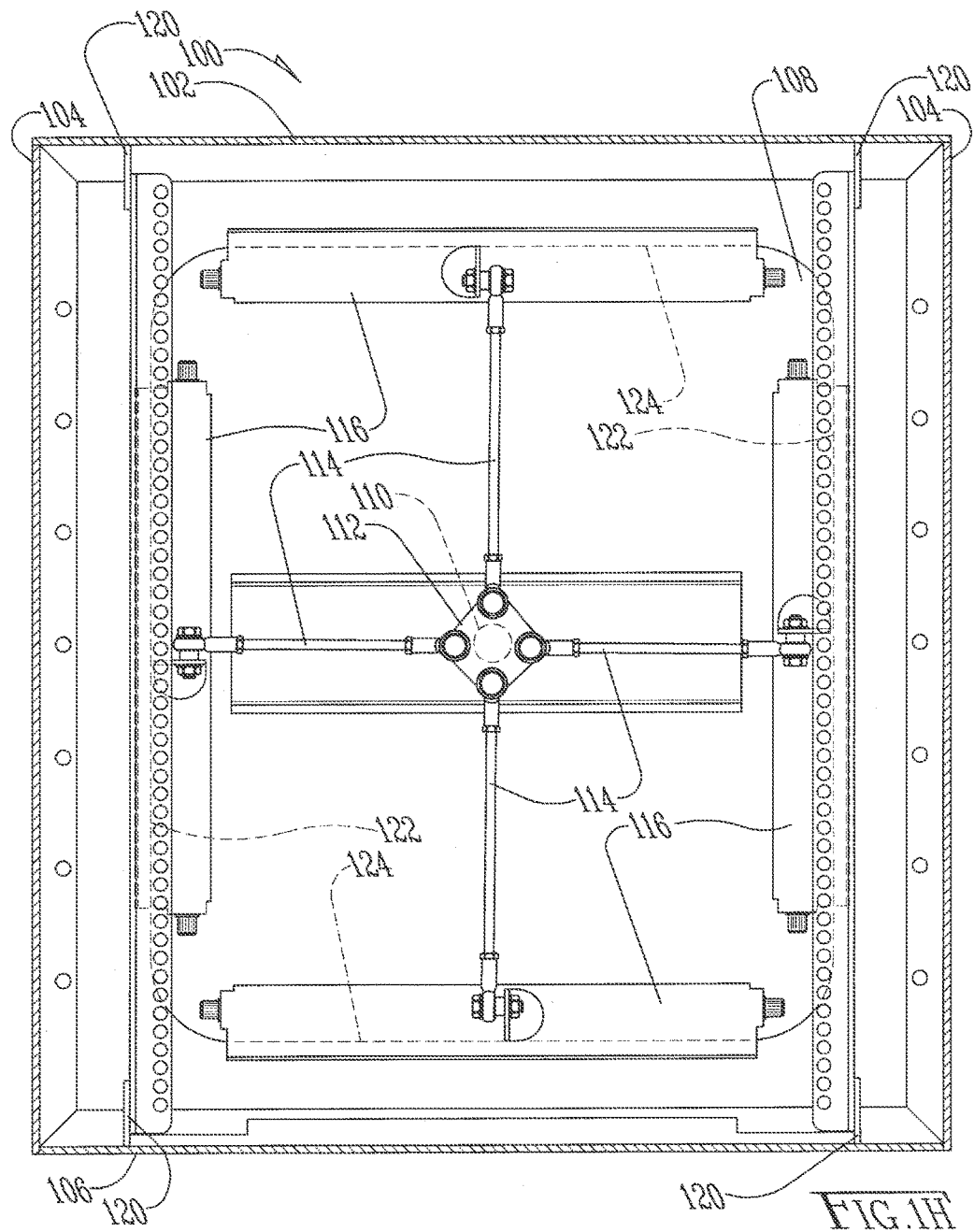
FIG. 1H is a cross-sectional view of an embodiment of the below grade enclosure.

The below grade enclosure provides below grade connectivity in an outside plant environment when deployed in a below-grade vault. It may also be installed in above grade installations if desired. In some embodiments, the below grade enclosure provides for up to 72 hours of water intrusion protection when fully submerged in a below grade installation. The enclosure may be configured to support a variety of deployment strategies, including without limitation, fiber distributed split to cross-connect configurations from 144 to 432 ports, copper network installations, and other network technologies. In some embodiments, the enclosure provides a "swing-up and lock" door mechanism or a "vertical pull-up and lock" door mechanism for easy and quick single-door access to the interior of the enclosure. In other embodiments the enclosure is provided with a lift assist system to provide for lifting the enclosure from a below grade position to an above grade position for easier access by a technician.

In outside application environments where placement or easement permitting is not cost-effective, the below grade enclosure can leverage existing below grade assets or facilities in polymer concrete or HDPE vaults and hand-holes by providing environmental protection and connectivity across a variety of transport and configuration methods. In environments where above grade placement of cabinets, pole-mounted or on the ground, is prohibited, the below grade enclosure meets the requirement without sacrificing necessary environmental protection and functionality, such as the key fiber management rules of access, bend radius protection, physical fiber protection, and route diversity that exist in current platforms that are standard in the industry.

In some embodiments, the below grade enclosure can also provide below grade connectivity to the traditional telephone network Serving Area Closure (SAC) that utilize existing copper networks.

Even though the below grade enclosure was designed to provide below grade connectivity, it can also be used in the various other network applications such as; indoor applications, Outdoor wall applications or Ground-Level Applications when deployed in areas susceptible to flooding.

In some embodiments, the enclosure and door described below may be constructed of 0.090 or 0.125 aluminum sheet material. In many embodiments, all enclosure parts are powder coated for additional protection. In some embodiments, 300 series stainless steel fasteners and hardware are used throughout the enclosure. In some embodiments, the latching mechanism is constructed of 300 series stainless steel or 0.125 aluminum with 300 series stainless steel fasteners and hardware. In some embodiments, an EPDM rubber gasket is used for sealing the door to the enclosure to prevent water intrusion.

The latching mechanism utilizes a single latch to operate the system and seal the enclosure from harsh outside environments. The latching mechanism is operated by a latch attached to a cam mechanism that activates four rods that are attached to four specially designed plates that are attached to the door at the top, the bottom, left and right sides of the door by means of brackets. Once the latch is activated the four plates engage to the inside wall of the top, bottom and sides of the enclosure to create the compression seal required to close the cabinet and maintain the seal from the outside environment.

Referring now of FIGS. 1A through 1I, an embodiment of the inventive enclosure is depicted. The depicted embodiment of the enclosure body 100 is provided with a top 102, three sides 104, and a bottom 106 attached together to form the body of the enclosure 100 with one open side. In many embodiments, the body 100 of the enclosure is cuboid, and may be a rectangular cuboid. The top, sides and bottom may be formed from a single sheet or separate sheets, and seams may be welded or otherwise permanently joined to form the body of the enclosure. Door 108 is provided to removably cover and seal the open side of the enclosure body. In some embodiments, the door 108 fits between the edges of sides 104, top 102 and bottom 106 as depicted in FIGS. 1A through 1I, while in other embodiments door 108 overlaps the edges of sides 104, top 102 and bottom 106. A latch 110 is provided in the door 108 to allow a user to unseal the door 108 and access the interior of the enclosure 100. Door 108 may be removed from the enclosure body by actuating the latch 110 and removing the door 108 as shown in FIG. 1E. Door 108 may be attached to the body 100 via a hinge on one side or it may be completely removable upon releasing the latch 110.

Referring now to FIG. 1 F, a detailed exploded view of a portion of the enclosure 100 is depicted. The top 102 and sides 104 are not shown for clarity. Door 108 is provided with a mounting hole for latch 110, which is rotatably secured in the hole to cam 112. Four actuating rods 114 are pivotally attached at one end to the cam 112. As the latch is rotated, cam 112 rotates and causes the actuating rods 114 to move substantially linearly back and forth towards the edges of door 108. The four actuating rods 114 are pivotally attached at their other end, or at a point away from their first end, to compression plates 116 via a bracket, ball joint or other pivotal connection. As the actuating rods 114 are moved back and forth by the rotation of cam 112, the rods 114 pull back and forth on the compression plates 116. The compression plates 116 extend substantially parallel to the edges of door 108. Each compression plate 116 is pivotally attached to the door 108 at one or more points such as brackets 118. The attachment points 118 are disposed closer to the inner edge 117 of the plates 116 so that as the actuating rods 114 pull inwardly on the plates 116, the outer edges 119 of the compression plates 116 move away from the inner surface of door 108, and as the actuating rods 114 push outwardly on the compression plates 116, the outer edges of the compression plates 116 pivot toward the inner surface of door 108. Mounting brackets 118 may be provided on the inner surface of door 108 for pivotal attachment of compression plates 116.

In some embodiments, on the inner surface of bottom 106 and on the inner surface of the top 102 (not depicted), one or more mounting brackets 120 are provided. In some embodiments, the mounting brackets 120 provide an adjustable attachment for vertical stiles 121 for the attachment of equipment. In the depicted embodiment two vertical stiles 121 are provided. Mounting brackets 120 may be provided with lengthwise slots or a series of holes to allow for the adjustability of the location of the vertical stiles 121. In other embodiments, varying types of mounting brackets or hardware may be used depending on the type of equipment to be installed in the enclosure.

Side, top and bottom compression rails 122 and 124, respectively, are attached to the inner surfaces of the top 102 and bottom 106, respectively, or are incorporated into flanges around the inside of the open side of the body 100. The flanges may have a lip extending outwardly therefrom to engage a seal provided on the inside of door 108, or vice versa. The spacing of the compression rails 122 and 124 is disposed so that when the latch 110 is in the open position, compression plates 116 are retracted from the surface of the door 108 sufficiently to allow the compression plates 116 to be inserted between compression rails 122 and 124, allowing door 108 to be securely seated against the open side of the enclosure body. As the latch 110 is rotated, cam 112 translates the actuating rods 114 thus pivoting the compression plates 116 and causing the outer portions of compression plates 116 to engage compression rails 122 and 124. In some embodiments, the compression plates 116 engage flanges or other features attached to or incorporated into compression rails 122 and 124 or into the body 100. As the latch 110 continues to rotate, compression plates 116 apply force on the door pulling it toward compression rails 122 and 124, and seating door 108 securely against the enclosure body and creating a water resistant or water tight seal.

As shown in FIG. 1l, in some embodiments the door 108 may be pivotally attached at one edge to the enclosure body to allow it to be rotated open after the latching mechanism has been disengaged by counter-rotation of the latch 110. In some embodiments, one or more seals or gaskets 126 are provided on the interior surface of door 108 to engage the surface of compression rails 122 and 124. In some embodiments, the gaskets 126 may be provided on the outside of the compression rails 122 and 124. In some embodiments, flanges or other features may be provided on the door 108, compression rails 122 and 124, or both to engage gaskets 126.

Referring now to FIG. 2, a perspective view of an embodiment of the invention depicts an embodiment having a hinge pivotally attaching the door 108 to the enclosure body 100.

Figure 3:
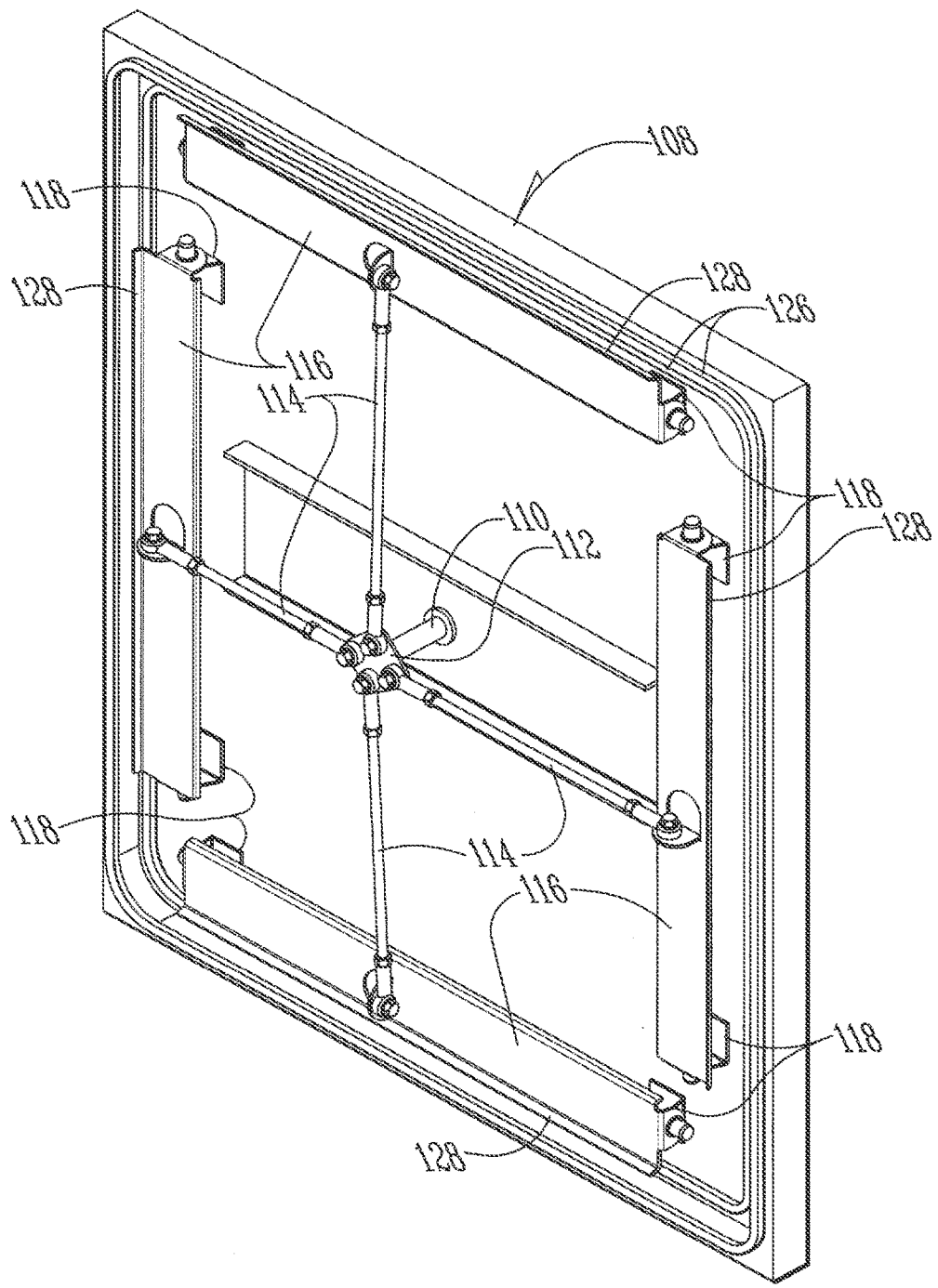
FIG. 3 is a view of the inside of a portion of an embodiment of the below grade enclosure.

Referring now to FIG. 3, a detailed view of the inside of door 108 is depicted showing cam 112, actuating rods 114, and compression plates 116 in a closed position such as when it is sealed onto the body 100. The cam 112 is positioned to rotate the outer edge of plates 116 toward the door 108 to exert force on rails 122 and 124. One or more seals or gaskets 126 may be provided on door 108 to provide a water resistant or water tight seal between door 108 and the enclosure body 100. In some embodiments flange 128 may be provided along the outer edge of compression plates 116.

Figure 4:
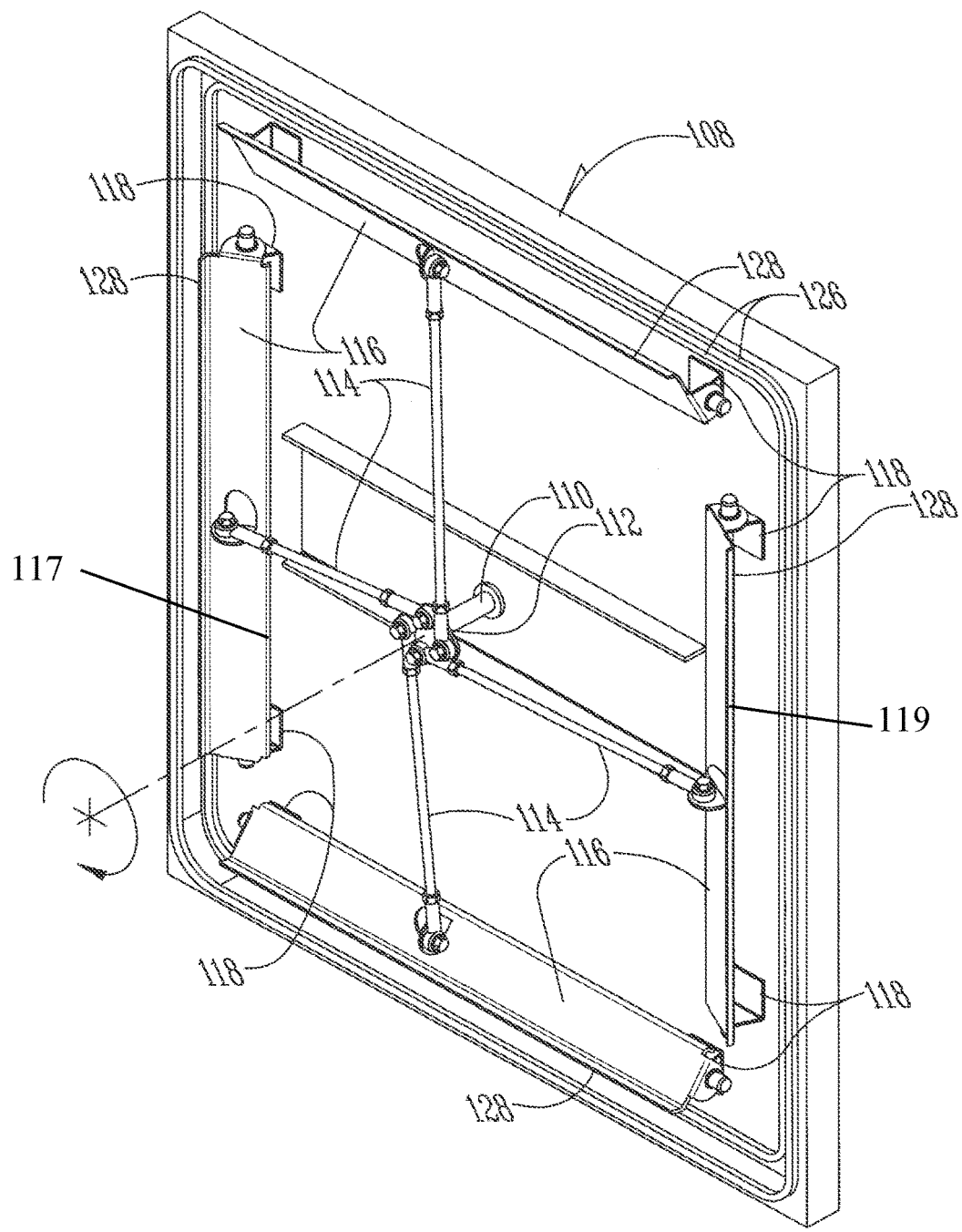
FIG. 4 is a view of the inside of a portion of an embodiment of the below grade enclosure.
Figure 5:
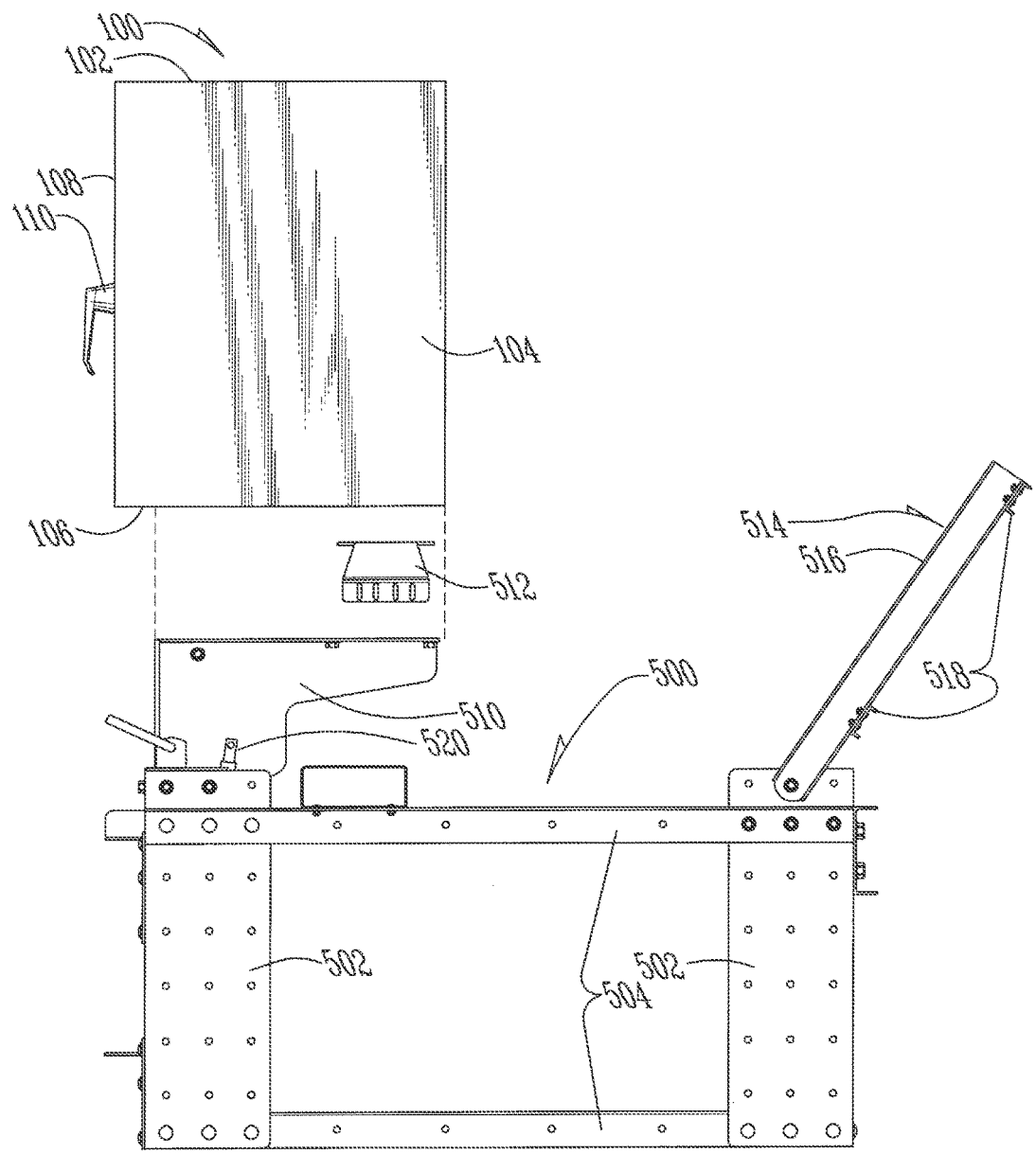
FIG. 5 is a side exploded view of an embodiment of the below grade enclosure with a lift assist system.
Figure 6:
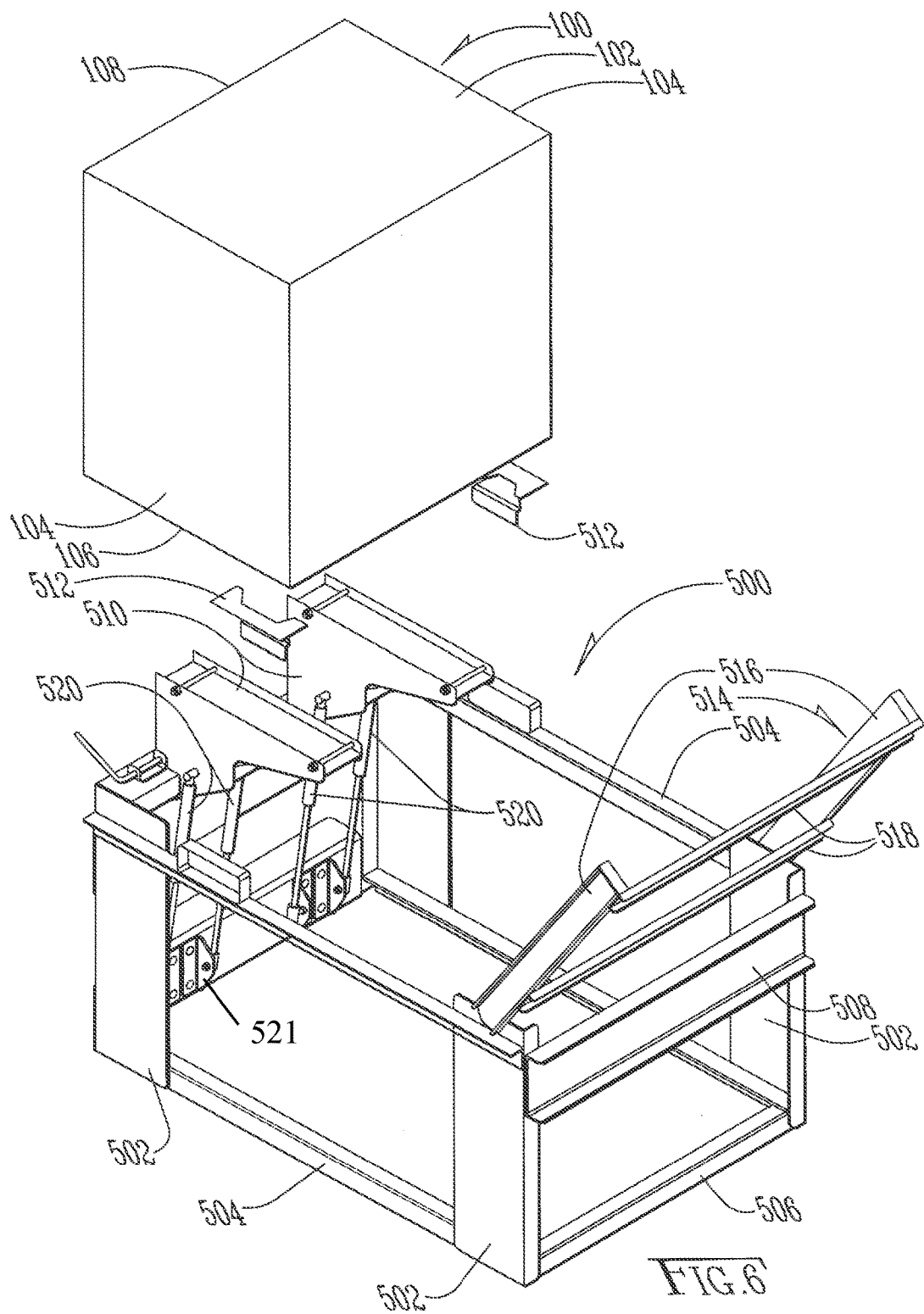
FIG. 6 is a perspective exploded view of an embodiment of the below grade enclosure with a lift assist system.

Referring now to FIG. 4, the cam 112 has been rotated to retract the plates 116 away from the door 108 and to release pressure from rails 122 and 124. The rotation of cam 112 causes actuating rods 114 to retract away from compression plates 116 causing them to pivot so that their outer edges rotate away from the inside surface of door 108. This position releases the seal between door 108 and enclosure body 100, and allows door 108 to be inserted into or retracted from the opening in body 100.

Referring now to FIGS. 5, 6, 8, and 9, an embodiment of the below ground enclosure with a frame and lift assist system is depicted in various configurations. A frame 500 is provided for supporting the enclosure 100 and providing a means for lifting the enclosure 100 above ground level to allow easy access to the interior of the enclosure 100. In the embodiment depicted in the referenced figures, the frame 500 comprises rails and stiles forming a cuboid frame. In other embodiments the frame 500 may be a paralleliped or have only a top frame with legs extending downwardly. The exact configuration of frame 500 is not limiting of the invention. In the depicted embodiment the frame 500 defines a cuboid volume in which the enclosure 100 is disposed as shown in FIG. 7.

In the depicted embodiment, stiles 502 and rails 504 form side frames which are connected by end rails 506 and 508 to form the frame 500. In other embodiments the sides and ends of the frame 500 may be formed from sheet material, or may have other configurations such as triangular braces. The top surface of frame 500 is open to allow enclosure 100 to be raised and lowered into the frame 500. The rails and stiles may be formed from metal channel or other materials that are suitably rigid and suitable for below grade installation.

At the upper edge of one of the ends of frame 500, one or more lift brackets 510 are pivotally attached to the frame 500. In some embodiments the pivotal attachment is a bolt 523 as shown in FIG. 9. The lift brackets 510 are attached so that they may be pivoted between a horizontal stowed position located down in the volume defined by frame 500 and a vertical service position extending upwardly from the top edge of frame 500, as desired. The brackets 510 are shown in the vertical service position in FIG. 6. The top of brackets 510 are attached to the bottom surface 106 of enclosure 100 by welding, bolts, screws or other suitable means of attachment.

Strain relief brackets 512 may be provided on the bottom surface of enclosure 100 or on brackets 510 to engage frame 500 when the enclosure is in the lowered position. Strain relief brackets 512 reduce the strain on the pivotal attachment of the brackets 510 to frame 500 when the enclosure is in the horizontal stowed position.

In some embodiments, the frame also comprises a top component for securing the enclosure 100 within frame 500 when it is in the horizontal stowed position. In the embodiment depicted in FIGS. 5 to 9, the top component is pivotally attached to the frame 500 so that it may be pivoted up to allow the enclosure 100 to be pivoted up for service. In the depicted embodiment, the top component is attached to the opposing end of the frame 500 with respect to the attachment of brackets 510. The depicted embodiment of the top component comprises at least one stile 516 and at least one rail 518, attached perpendicularly to each other to create the top component. Ends of stiles 516 are pivotally attached to frame 500 to allow it to pivot upwardly from the frame. A rail 518 may be disposed to cross the enclosure 100 when the enclosure and the top component are stowed and to secure it in place. The top component may be provided with locking means or other means of securing it in the closed position to prevent unauthorized access to the enclosure 100.

In some embodiments, one or more struts 520 may be provided to assist with the raising and lowering of the enclosure 100 from and into frame 500. The struts 520 are attached between the frame 500 and brackets 510. In the depicted embodiment, the rod end of each strut 520 is pivotally attached, such as by a ball and socket, to a bracket 521 attached to frame 500. Similarly, the tube end of each strut 520 is pivotally attached, such as by a ball and socket, to one of the brackets 510. In some embodiments, the struts 520 are gas struts. The struts 520 assist in the lowering of the enclosure 100 into frame 500 by preventing it from an uncontrolled drop of the enclosure 100 into the frame 500 and by assisting in controlled lifting of the enclosure 100 to the raised service position.

In some embodiments, the frame 500 is constructed of G-90 Galvanized steel or 300 series stainless steel with 300 series stainless steel fasteners and hardware.

As depicted in FIG. 7, in some installations the enclosure 100 and the frame 500 are placed in a vault, or hand-hole, 700. In some installations the vault 700 is made of polymer concrete or HDPE, though other materials may be used in some installations. The frame 500 is installed on base 702 at the bottom of vault 700. Once installed into the vault 700, the enclosure 100 may be raised using one hand for service and stowed into the vault 700 using one hand. The vault 700 is typically installed so that the enclosure 100 is disposed below ground level 704 in the horizontal stowed position.

The various embodiments of the enclosure may be used by various methods. In one embodiment of the enclosure, it is used by installing the enclosure in a desired location, installing equipment within the enclosure body, and securing the door to the enclosure body.

In embodiments of the enclosure having the lift assist system, a method of using the enclosure comprises the steps of installing the lift assist system in a desired location such as a below grade vault, attaching the enclosure body to the lift brackets of the lift system in either the stowed position or the service position, installing equipment into the enclosure, and securing the door to the enclosure body. During the method at relevant points, the enclosure body may be raised or lowered from the stowed position within the frame (shown in FIG. 7) to the service position (shown in FIGS. 5, 6, 8 and 9).

Another method of using the invention may comprise raising the enclosure body from the stowed position to the service position, removing the door from the enclosure body, servicing equipment installed in the enclosure body, securing the door to the enclosure body, and lowering the enclosure body to the stowed position. In other methods the top component is used to secure the enclosure body in the stowed position by pivoting it down over the enclosure body. The top component is pivoted away from the enclosure body to allow the enclosure body to be raised to the service position.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

What is claimed is:

1. An enclosure for telecommunications equipment, the enclosure comprising:
   an enclosure body comprising a top, a bottom, three side walls, and a fourth side wall having an opening therein forming a cuboid;
   at least one compression rail disposed adjacent to an edge of the opening in the fourth side wall;
   a door for attachment over the open side of the enclosure body having an inside surface and an outside surface;
   a latch rotatably attached to and extending from the outside surface to the inside surface of the door;
   a cam attached to the latch adjacent to the inside surface of the door;
   at least one compression plate pivotally attached to the inside surface of the door such that the at least one compression plate pivots around an axis that is substantially parallel to the inside surface of the door;
   at least one actuating rod, each at least one actuating rod having a first end pivotally attached to the cam and a second end pivotally attached to the at least one compression plate;
   wherein rotation of the latch causes rotation of the cam, thereby causing the at least one actuating rods to extend, pivoting the at least one compression plate to compress the compression rails between the compression plates and the inside surface of the door.

2. The enclosure of claim 1 wherein the at least one compression plate comprises four compression plates, and wherein the at least one compression rail comprises four compression rails, each of the four compression plates for engaging one of the four compression rails.

3. The enclosure of claim 2 further comprising at least one gasket attached to the inside surface of the door.

4. The enclosure of claim 2 further comprising a lift assist system, the lift assist system comprising:
   a frame sized to receive the enclosure body within the frame for supporting the enclosure body;
   at least one lift bracket pivotally attached to the frame and fixedly attached to the bottom of the enclosure body;
   wherein the at least one lift bracket is capable of pivoting from a stowed position in which the enclosure body is disposed within the frame to a service position in which the enclosure body is disposed outside the frame; and
   at least one lift assist strut to reduce the force needed to move the enclosure body from the stowed position to the service position and back, the at least one lift assist strut having a first end pivotally attached to the frame and a second end attached to the at least one lift bracket.

5. The enclosure of claim 4 further comprising a top component for securing the enclosure body within the frame when the enclosure body is in the stowed position, the top component comprising:
   at least one stile pivotally attached to the frame; and
   at least one rail attached to the at least one stile to secure the enclosure body within the frame in the stowed position;
   wherein the top component may be pivoted away from the enclosure body to allow the enclosure body to be raised to the service position.

6. A method of using the enclosure of claim 4 in a below grade vault, comprising the steps of:
   installing the lift assist system in the below grade vault;
   attaching the enclosure body to the at least one lift bracket of the lift assist system in the service position;
   installing equipment within the enclosure body;
   securing the door to the enclosure body;
   lowering the enclosure body to the stowed position.

7. The method of claim 6 further comprising the steps of:
   raising the enclosure body to the service position;
   removing the door from the enclosure body;
   servicing the equipment installed within the enclosure body;
   securing the door to the enclosure body;
   lowering the enclosure body to the stowed position.

8. The method of claim 6 wherein the step of securing the door to the enclosure body comprises the steps of:
   disposing the door over the open side of the enclosure body;
   rotating the latch to pivot the four compression plates to compress the four compression rails between the four compression plates and the inside surface of the door.

9. The method of claim 8 further comprising the steps of:
   pivotally attaching a top component to the frame, wherein the top component has at least one rail for securing over the enclosure body in the stowed position;
   pivoting the top component into a lowered position to secure the enclosure body in the stowed position;
   pivoting the top component into a raised position to allow the enclosure body to be lifted to the service position.

* * * * *